(12) United States Patent
Beale et al.

(10) Patent No.: US 8,154,358 B2
(45) Date of Patent: Apr. 10, 2012

(54) SYSTEM AND METHOD OF CHANGING A PWM POWER SPECTRUM

(75) Inventors: Richard Beale, Austin, TX (US); John Khoury, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 0 days.

(21) Appl. No.: 12/729,000

(22) Filed: Mar. 22, 2010

(65) Prior Publication Data

US 2010/0171540 A1 Jul. 8, 2010

Related U.S. Application Data

(63) Continuation of application No. 12/187,873, filed on Aug. 7, 2008, now Pat. No. 7,701,307, which is a continuation-in-part of application No. 12/126,125, filed on May 23, 2008, now Pat. No. 7,598,895.

(60) Provisional application No. 61/072,563, filed on Apr. 1, 2008.

(51) Int. Cl.
  *H03F 3/38* (2006.01)
  *H03K 7/08* (2006.01)
(52) U.S. Cl. ........... 332/107; 332/109; 330/10; 375/238
(58) Field of Classification Search .................. 332/107, 332/109–111; 327/172–177; 330/10; 375/238
See application file for complete search history.

(56) References Cited

U.S. PATENT DOCUMENTS

| | | | |
|---|---|---|---|
| 5,014,016 A | 5/1991 | Anderson | |
| 5,247,581 A | 9/1993 | Gurcan | |
| 5,389,829 A | 2/1995 | Milazzo | |
| 5,672,998 A | 9/1997 | Wittlinger | |
| 5,798,672 A | 8/1998 | Masini et al. | |
| 6,097,249 A | 8/2000 | Strickland et al. | |
| 6,127,885 A | 10/2000 | Colangelo | |
| 6,160,455 A | 12/2000 | French et al. | |
| 6,297,692 B1 | 10/2001 | Nielson | |
| 6,552,606 B1 | 4/2003 | Veltman et al. | |
| 6,552,607 B1 | 4/2003 | Danielson | |
| 6,563,377 B2 | 5/2003 | Butler | |
| 6,594,309 B1 | 7/2003 | Botti et al. | |
| 6,597,240 B1 | 7/2003 | Walburger et al. | |

(Continued)

OTHER PUBLICATIONS

Kempski & Smolenski, A. & R.; "Decomposition of EMI Noise into Common and Differential Modes in PWM Inverter Drive System," Electrical Power Quality and Utilisation Journal, V. XII, N. I, 2006, 6 pgs.

(Continued)

*Primary Examiner* — David Mis
(74) *Attorney, Agent, or Firm* — Cesari & Reed, LLP; R. Michael Reed

(57) ABSTRACT

In a particular embodiment, a circuit device includes a pulse edge control circuit to receive at least one pulse-width modulated (PWM) signal from a PWM source. The pulse edge control circuit is adapted to selectively invert and swap the at least one PWM signal with a logic-inverted duty-cycle complement of the at least one PWM signal at discrete time intervals to produce at least one modulated PWM signal having a changed power spectrum. The pulse edge control circuit provides the at least one modulated PWM signal to at least one output of the pulse edge control circuit.

26 Claims, 11 Drawing Sheets

U.S. PATENT DOCUMENTS

| | | |
|---|---|---|
| 6,653,897 B2 | 11/2003 | Sawashi |
| 6,794,932 B1 | 9/2004 | Butler |
| 6,847,257 B2 | 1/2005 | Edwards et al. |
| 7,046,080 B2 | 5/2006 | Watts et al. |
| 7,068,095 B2 | 6/2006 | Bernardon |
| 7,078,964 B2 | 7/2006 | Risbo et al. |
| 7,119,629 B2 | 10/2006 | Nielsen et al. |
| 7,142,049 B2 | 11/2006 | Kirn |
| 7,142,050 B2 | 11/2006 | Risbo |
| 7,190,224 B2 | 3/2007 | Sutardja |
| 7,218,173 B2 | 5/2007 | Nalbant |
| 7,230,485 B2 | 6/2007 | De Cremoux et al. |
| 7,242,248 B1 | 7/2007 | Sutardja |
| 7,262,658 B2 | 8/2007 | Ramaswamy et al. |
| 7,279,965 B2 | 10/2007 | Hansen et al. |
| 7,298,209 B1 | 11/2007 | Sutardja |
| 7,301,417 B2 | 11/2007 | Shinohara |
| 7,332,962 B2 | 2/2008 | Wu et al. |
| 7,598,895 B1 * | 10/2009 | Khoury .......... 341/152 |
| 7,701,307 B2 * | 4/2010 | Beale et al. .......... 332/107 |
| 7,724,105 B2 * | 5/2010 | Alderson et al. .......... 332/107 |
| 7,821,440 B2 * | 10/2010 | Khoury .......... 341/152 |
| 2003/0020539 A1 | 1/2003 | Sawashi |
| 2003/0067348 A1 | 4/2003 | Butler |
| 2003/0122615 A1 | 7/2003 | Zeff |
| 2004/0169552 A1 | 9/2004 | Butler |
| 2004/0232978 A1 | 11/2004 | Easson et al. |
| 2004/0232979 A1 | 11/2004 | Edwards et al. |
| 2005/0054307 A1 | 3/2005 | Watts et al. |
| 2005/0083114 A1 | 4/2005 | Risbo |
| 2005/0083115 A1 | 4/2005 | Risbo |
| 2005/0083116 A1 | 4/2005 | Risbo et al. |
| 2005/0099231 A1 | 5/2005 | Sutardja |
| 2005/0116770 A1 | 6/2005 | Kirn |
| 2005/0200404 A1 | 9/2005 | Bernardon |
| 2006/0008095 A1 | 1/2006 | Tsuji |
| 2006/0077007 A1 | 4/2006 | De Cremoux et al. |
| 2006/0103458 A1 | 5/2006 | Hansen et al. |
| 2006/0226904 A1 | 10/2006 | Nalbant |
| 2006/0279354 A1 | 12/2006 | Hansen et al. |
| 2007/0002943 A1 | 1/2007 | Midya |
| 2007/0024365 A1 | 2/2007 | Ramaswamy et al. |
| 2007/0146069 A1 | 6/2007 | Wu et al. |
| 2007/0229159 A1 | 10/2007 | Krishnan et al. |
| 2008/0042743 A1 | 2/2008 | Wong et al. |

OTHER PUBLICATIONS

Ogasawara & Akagi, S. & H.: "Suppression of Common Mode Voltage in PWM Rectifier/Inventer System." Dept. of Electrical Engineering, Tokyo Institute of Technology, IEEE 2001, pp. 2015-2021.

* cited by examiner

SYSTEM AND METHOD OF CHANGING A PWM POWER SPECTRUM

CROSS-REFERENCE TO RELATED APPLICATION

The present application is a continuation application of U.S. patent application Ser. No. 12/187,873 filed on Aug. 7, 2008 and entitled "SYSTEM AND METHOD OF CHANGING A PWM POWER SPECTRUM," now U.S. Pat. No. 7,701,307, which application is non-provisional patent application of and claims priority from U.S. provisional patent application Ser. No. 61/072,563, filed Apr. 1, 2008 and entitled "COMMON MODE CARRIER SUPPRESSION AND SPECTRAL SHAPING IN CLASS D AMPLIFIERS," the content of which is hereby incorporated by reference in its entirety; and which application is a continuation-in-part of and claims priority from U.S. patent application Ser. No. 12/126,125, filed on May 23, 2008 and entitled "SYSTEM AND METHOD OF ALTERING A PWM CARRIER POWER SPECTRUM, now U.S. Pat. No. 7,598,895, the content of which is hereby incorporated by reference in its entirety.

FIELD OF THE DISCLOSURE

The present disclosure is generally related to a system and method of changing a pulse-width modulated (PWM) power spectrum. More particularly, the present disclosure is generally related to modulating a PWM signal to produce a modulated PWM signal having at least one of a suppressed carrier and an altered PWM power spectrum.

BACKGROUND

In general, class D audio amplifiers have the benefit of high power efficiency. However, such amplifiers also have a drawback in terms of electromagnetic interference (EMI), which can interfere with nearby wireless receivers, violate FCC emission limits, introduce noise into various signal paths, or any combination thereof. In a particular example related to audio applications, switching frequencies can range from approximately 200 kHz to 1000 kHz. In class D amplifiers, the resulting carrier and its harmonics due to such switching often overlap with the amplitude modulated (AM) frequency band, which ranges from approximately 520 kHz to 1710 kHz. Thus, the class D amplifier may cause EMI that can interfere with nearby AM receivers unless some "mitigation" techniques are used. Class D amplifiers can also be used in connection with switched power supplies, direct-current to direct-current (DC-DC) converters, data converters, motor controllers, other systems that use pulse-width modulation, or any combination thereof. In each such instance, the class D amplifiers can generate electromagnetic interference (EMI) and can interfere with AM frequency bands and other sensitive frequency bands.

In general, class D amplifiers can use a variety of modulation techniques. One common modulation technique is referred to as BD double sided (BD-D) pulse width modulation (PWM). In general, BD-D PWM includes varying the pulse width of two complementary pulse waves where the centers of the pulses are time-aligned and often centered within a pulse width modulated (PWM) frame. For positive input signals, a pulse width of the input signal (typically referred to as P or B) that drives the high side of a bridged output is increased, while a complementary pulse width of the signal that drives the low side (typically referred to as N or D) of the bridged output is reduced. Unfortunately, such BD modulation results in the common mode carrier frequency being centered inconveniently at the frame rate. In a particular example where the switching frequencies for audio applications overlap with the AM band, the common mode carrier and its harmonics can radiate energy in the AM frequency band, interfering with reception of an AM radio receiver in close proximity or within the same system.

One technique employed in the prior art for mitigating AM radio interference includes adjusting the PWM carrier signal away from the desired radio station frequency. While such adjustments may avoid interfering with a co-resident AM radio receiver, it is not practical for avoiding interference with a non co-resident AM receiver (since the desired radio frequency may not be known) and does not help suppress EMI for emission compliance. Further, a technique employed in the prior art for suppressing EMI for emission compliance includes dithering the frequency of the PWM carrier signal. However, the dithering technique provides modest average EMI suppression, sometimes has minimal suppression of instantaneous peak carrier interference, and can adversely impact the integrity of the baseband signal and limit a maximum modulation index of the signal. Therefore, it is desirable to meaningfully suppress the PWM carrier signal power with little or no compromise in the baseband signal performance.

SUMMARY

In a particular embodiment, a circuit device includes a pulse edge control circuit to receive at least one pulse-width modulated (PWM) signal from a PWM source. The pulse edge control circuit is adapted to selectively swap the at least one PWM signal with a logic inverted, duty cycle complement of the at least one PWM signal at discrete time intervals to produce at least one modulated PWM signal having a changed power spectrum. The pulse edge control circuit provides the at least one modulated PWM signal to at least one output of the pulse edge control circuit.

In another particular embodiment, a circuit device includes a pulse edge control circuit to receive complementary PWM signals via at least two inputs. The pulse edge control circuit is adapted to selectively apply a chopping operation to the received PWM signals at discrete time intervals to produce modulated PWM signals having suppressed carriers. The pulse edge control circuit provides the modulated PWM signals to respective outputs of the pulse edge control circuit, where selectively applying the chopping operation includes selectively inverting and swapping the received PWM signals.

In still another particular embodiment, a method is disclosed that includes receiving at least one pulse-width modulated (PWM) signal at a pulse edge control circuit. The method further includes selectively swapping the at least one PWM signal with a logic inverted, duty cycle complement of the at least one PWM signal at discrete time intervals to produce at least one modulated PWM signal having a changed power spectrum. The method also includes providing the at least one modulated PWM signal to a corresponding at least one output.

DETAILED DESCRIPTION OF ILLUSTRATIVE EMBODIMENTS

In a particular embodiment, a pulse edge control circuit and method is disclosed that uses a selective chopping operation (i.e., selective application of an invert and swap operation) to alter a power spectrum of a modulated PWM output signal. In a particular example, by alternately (either periodically or randomly) chopping and not chopping one or more received complementary PWM signals, a modulated PWM output signal or signals can be created that include at least one of a suppressed carrier power, a whitened power spectrum, or a power spectrum with carrier energy concentrated at frequencies other than the carrier frequency. Further, the selective application of the chopping operation to a pair of received complementary PWM signals allows for suppression of a common mode carrier without substantially altering a differential mode component of received complementary PWM signal pairs and with little or no compromise in the differential baseband signal performance.

Figure 1:
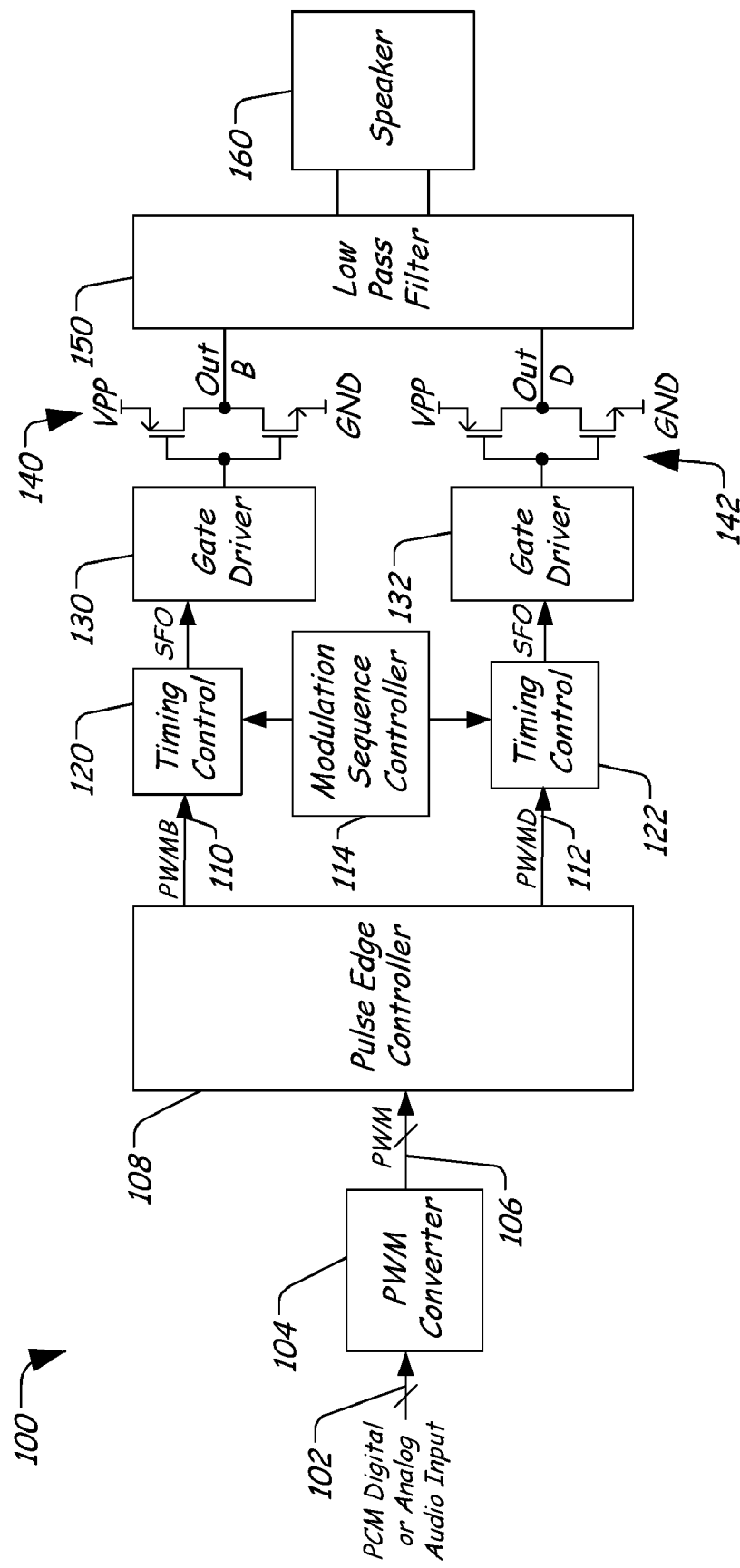
FIG. 1 is a block diagram of a first particular illustrative embodiment of a system to suppress a pulse-width modulation (PWM) carrier.

FIG. 1 is a block diagram of a first particular illustrative embodiment of a system 100 to suppress a pulse-width modulation (PWM) carrier. The system 100 includes an input 102 to receive a pulse-code-modulated (PCM) digital or analog audio input signal. The input 102 is coupled to a pulse-width modulated (PWM) converter 104, which converts the audio input signal into a PWM word 106 and which provides the PWM word 106 to a pulse edge controller 108. The pulse edge controller 108 outputs a PWM (PWMB) signal 110 and a PWM (PWMD) signal 112 to first and second timing control blocks 120 and 122, respectively. In a particular embodiment, the PWMB and PWMD signals 110 and 112 can be a complementary PWM signal pair. In a particular example, the PWMD signal 112 may be a duty cycle complement of the PWMB signal 110, such that the two signals 110 and 112 aggregate to approximately 100% of the duty cycle of the PWM frame. In particular, the aggregate of the two signals 110 and 112 may not equal 100% of the PWM frame due to quantization effects. The first timing control block 120 receives the PWMB signal 110 and drives one or more gate drivers 130 for output transistors 140 coupled between a supply voltage (VPP) and ground (GND) to provide a high side output signal (OUTB).

The second timing control block 122 receives the PWMD signal 112 and drives one or more gate drivers 132 for output transistors 142 coupled between a supply voltage (VPP) and ground (GND) to provide a low side output signal (OUTD). While the output transistors 140 and 142 are shown as simple complementary metal-oxide semiconductor (CMOS) inverters, in other particular embodiments, more complex output circuit topologies can be used.

The high side (OUTB) and low side (OUTD) signals from the output transistors 140 and 142 are provided to a speaker 160 through a demodulation low pass filter (LPF) 150. In a particular embodiment, the speaker 160 can be replaced with a direct current (DC)-to-DC converter for switched power applications or with other circuitry for other applications. Additionally, the system 100 includes a modulation sequence controller 114 that is coupled to the first and second timing control blocks 120 and 122 to selectively apply one or more modulation sequences to the PWMB and PWMD signals 110 and 112 to produce a modulated PWM output with a suppressed carrier.

In a particular embodiment, the first and second timing control blocks 120 and 122 are adapted to suppress a common mode carrier power and associated harmonics of the received PWM signal 106, such as a BD-D PWM signal, while maintaining other benefits of the BD-D PWM structure. In a particular example, a modulated PWM output signal can have a suppressed carrier power, a whitened power spectrum, a power spectrum with carrier energy concentrated at frequencies other than the carrier frequency, or any combination thereof. As explained below, the first and second timing control blocks 120 and 122 in conjunction with the pulse edge controller 108 can be adapted to suppress a carrier power and associated harmonics of the received PWM signal 106 without altering its carrier frequency, its frame repetition rate, the baseband signal, or any combination thereof.

In general, the pulse edge controller 108 and the first and second timing control blocks 120 and 122 are adapted to selectively apply a chopping operation to selectively chop and not chop the PWM signal 106 at discrete time intervals. In a particular embodiment, the discrete time intervals are integer sub-multiples of a frame repetition rate to suppress a carrier, to alter a power spectrum, or any combination thereof. In general, the term "integer sub-multiple of the frame repetition rate" refers to an interval that is related to the width of the frame, such that the chop operation is applied at the same temporal location within a frame and at regular intervals over a sequence of frames. In a particular example, the chop operation is selectively applied (i.e., chop or not chop) at a frame boundary every n-th frame. When the variable (n) is four (4), the chop operation is selectively applied at a temporal location within a frame (such as at a frame boundary) of every fourth frame. As used herein, the term "chop" or "chopping" refers to an invert and swap operation where two PWM signals are logically inverted and interchanged to maintain a differential mode component while suppressing a common mode carrier power. Additionally, a single input chop operation refers to an invert and swap operation applied to a received PWM signal with its duty cycle complement. In general, the PWM signal and its duty cycle complement have an aggregate duty cycle that represents an entire frame width (i.e., 100% of the frame width) within limits of quantization effects.

In a particular example, the place (temporal location) where the chop operation is applied can be at the frame boundary, at a half of the frame width (T/2), at a quarter of the frame width (T/4), or at other temporal locations within a frame and over a sequence of frames. Further, the chop operation can be selectively applied or not applied at every frame, every other frame, every n-th frame (where n is a positive integer), or randomly, over a sequence of frames. In a particular embodiment, the carrier energy of the modulated output signal is suppressed without altering the frame repetition rate, which is the rate at which frames (and not the content of the frames) repeat within a sequence of pulse width modulated frames.

Figure 2:
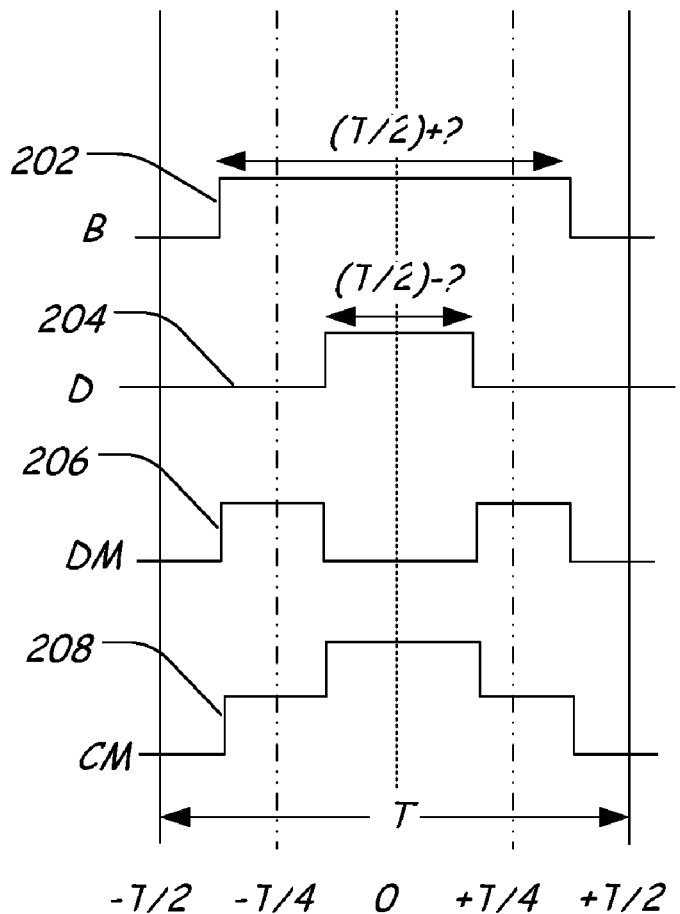
FIG. 2 is a graph of a particular representative embodiment of a conventional BD-D PWM signal where pulse widths of two pulse waves are varied, which pulse waves are time-aligned and often centered within a pulse width modulated (PWM) frame.

FIG. 2 is a graph of a particular representative embodiment of a conventional BD-D PWM signal 200 where pulse widths of two pulse waves are varied, which pulse waves are time-aligned and often centered within a pulse width modulated (PWM) frame. In general, BD-D PWM is used with many class D amplifiers at an output that drives an H-bridge, for example. The PWM frame has a time (T) and the pulse widths of the two signals (B and D) 202 and 204 are nominally centered within the PWM frame (at approximately T/2). For positive input signals, the pulse width of the signal that drives the high side of the bridged output (the "B" signal 202) is increased by delta ($\Delta$) while the pulse width of the signal that drives the low side of the bridged output (the "D" signal 204) is decreased by delta ($\Delta$).

In general, the result is a differential signal 206 across the load (i.e. a filter in cascade with a speaker) consisting of two positive pulses centered at +/−T/4, where T is the width of the PWM frame and where the reference time position T=0 represents the center of the frame. In general, the carrier frequency of the differential signal 206 is at twice the PWM frame rate.

Conversely, for negative input signals, the negative pulse width of the D signal 204 increases while the positive pulse width of the B signal 202 decreases resulting two similar but negative pulses. Differentially, this is an efficient arrangement since there is no (or very little) wasted differential energy. However, a strong common mode component 208 is created at the PWM frame rate, independent of whether the input is positive or negative.

Figure 3:
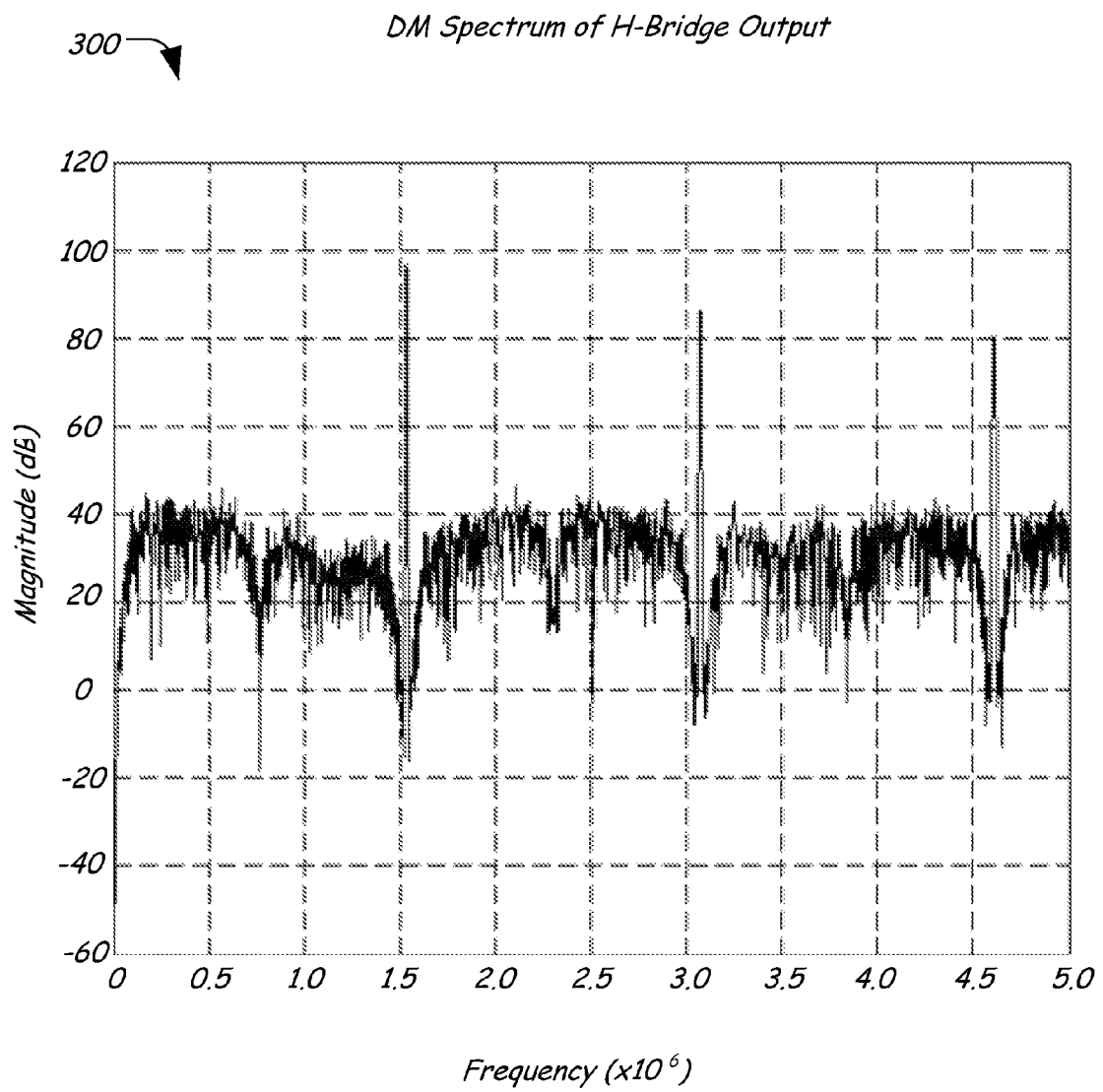
FIG. 3 is a graph of a differential mode (DM) power spectrum of an output signal using the BD-D PWM signal illustrated in FIG. 2 and using a 768 kHz frame rate.

FIG. 3 is a graph of a differential mode (DM) power spectrum 300 of an output signal using the BD-D PWM signal illustrated in FIG. 2 and using a 768 kHz frame rate. In particular, in the spectrum 300, the carrier frequency of the differential mode signal 206 (illustrated in FIG. 2) is at twice the frame rate of 768 kHz.

Figure 4:
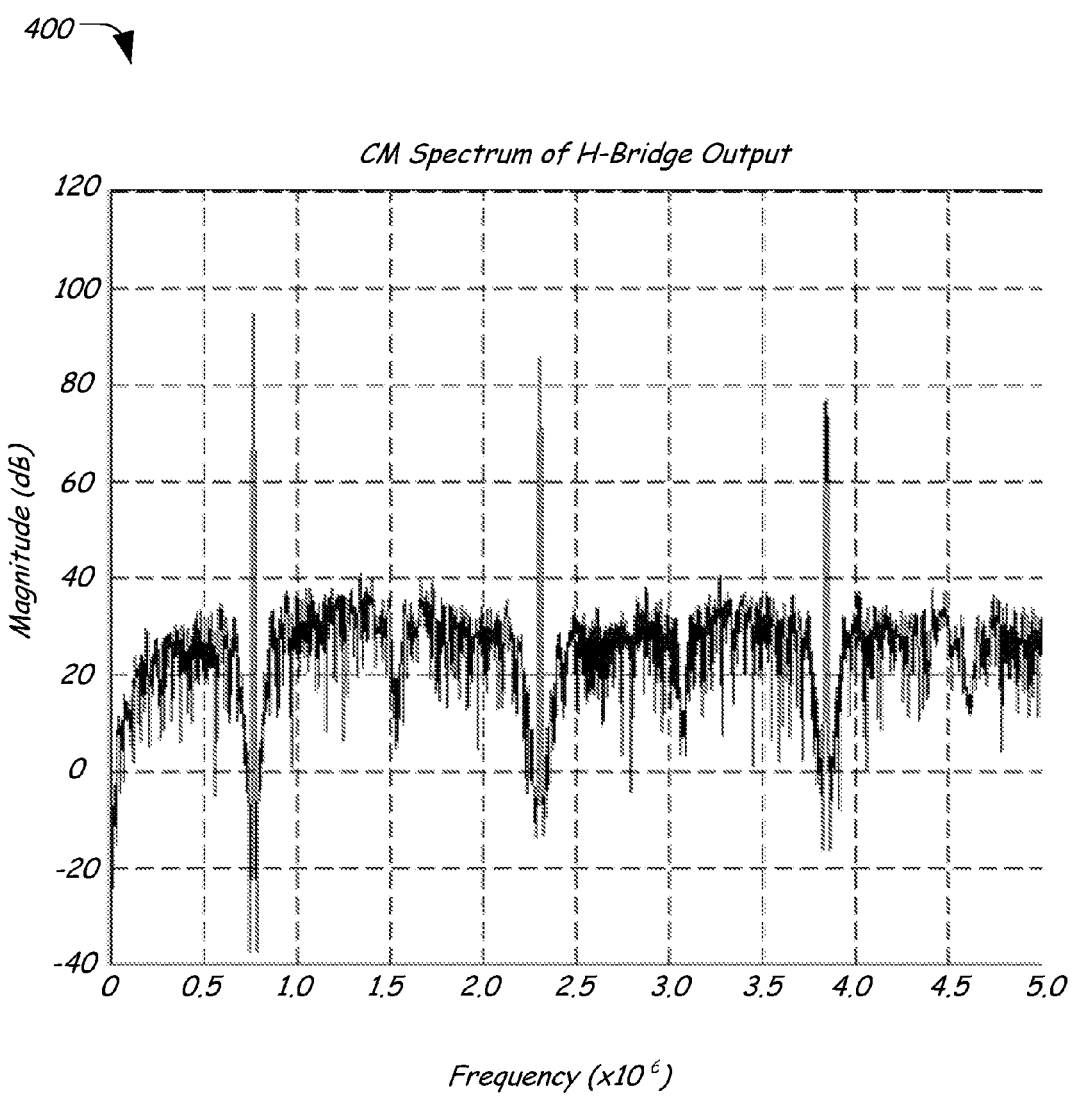
FIG. 4 is a graph of a common mode (CM) power spectrum of an output signal using the BD-D PWM signal illustrated in FIG. 2 and using a 768 kHz frame rate.

FIG. 4 is a graph of a common mode (CM) power spectrum 400 of an output signal using the BD-D PWM signal illustrated in FIG. 2 and using a 768 kHz frame rate. Unfortunately, the PWMB and PWMD signals within the pulse-width modulated (PWM) frame (such as the PWMB and PWMD signals 202 and 204 illustrated in FIG. 2) introduce a strong common mode component illustrated by the common mode spectrum 400 that is indicated by the peak common mode power levels at the carrier frequency and at odd harmonics of the carrier frequency, which peak power levels can generate electromagnetic interference (EMI) and amplitude modulated (AM) radio interference in nearby receiver circuitry. Further, the common mode carrier frequency is centered inconveniently at the frame rate. Given that practical switching frequencies for audio applications range from 200 kHz to 1000 kHz and the AM band ranges from 520 kHz to 1710 kHz, there is a problem with radiated energy of the common mode carrier and its harmonics interfering with reception of an AM radio in close proximity or in the same system. Therefore, it is desirable to suppress the common mode carrier of a BD PWM signal without compromising differential mode performance.

Figure 5:
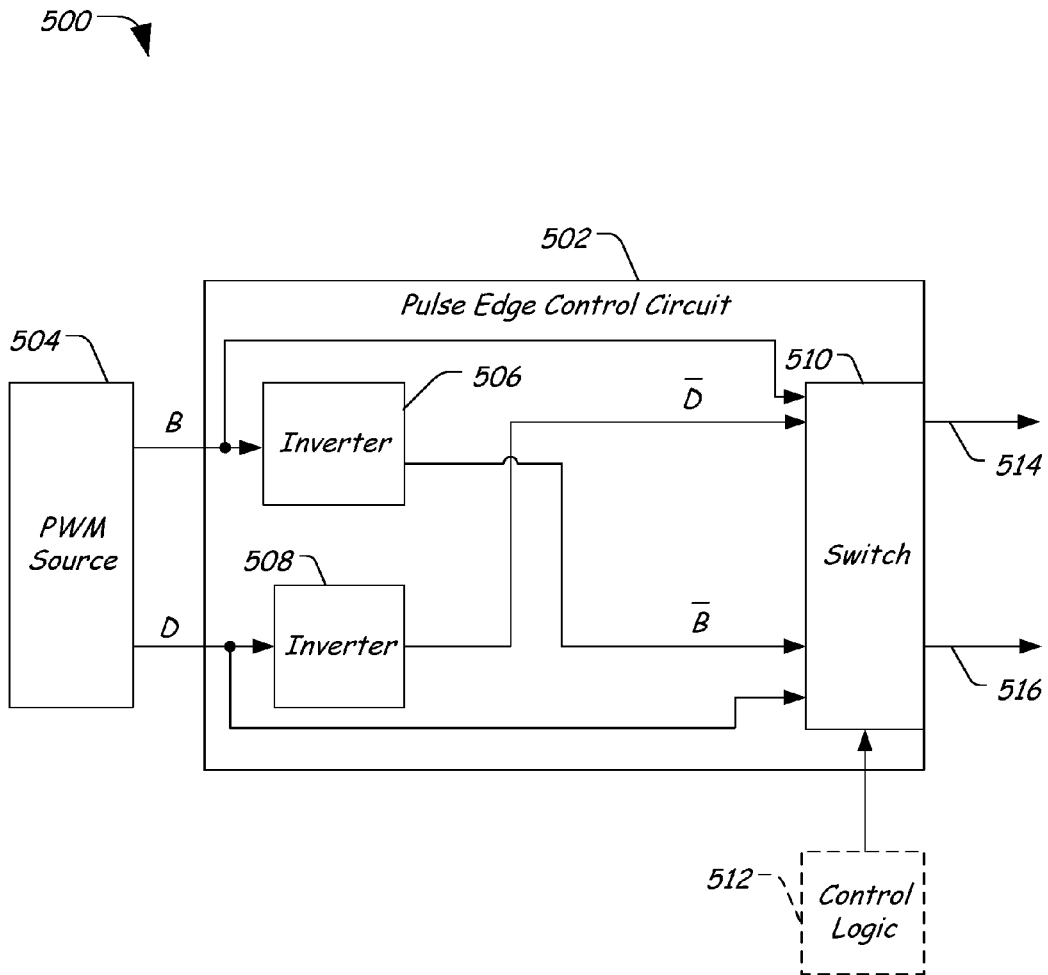
FIG. 5 is a block diagram of a second particular illustrative embodiment of a system to suppress a pulse-width modulation (PWM) carrier.

FIG. 5 is a block diagram of a second particular illustrative embodiment of a system 500 to suppress a pulse-width modulation (PWM) carrier. The system 500 includes a pulse edge control circuit 502 including at least two inputs to receive complementary pulse-width modulated (PWM) signals (such as PWMB and PWMD signals) from a PWM source 504. In general, the term complementary PWM signals refers to two PWM signals having a combined duty cycle of 100%, such that a first PWM signal has a first duty cycle and a second PWM signal has a second duty cycle that is equal to a width of the frame (T) minus the first duty cycle within limits of quantization effects. The pulse edge control circuit 502 also includes at least two outputs 514 and 516 that may be coupled to a circuit component, such as a filter, a load circuit (speaker), a switching stage of a power regulator, another circuit, or any combination thereof.

The pulse edge control circuit 502 includes a first inverter 506 and a second inverter 508 adapted to receive the complementary PWM signals via the at least two inputs. The first and second inverters 506 and 508 are adapted to logically invert the received complementary PWM signals. The outputs of the first and second inverters 506 and 508 are cross-coupled to a switch 510, such that a logic-inverted copy of the PWMD signal is provided as a PWMB signal to the switch 510 and a logic inverted copy of the PWMB signal is provided as a PWMD signal to the switch 510. Thus, the pulse edge control circuit 502 is adapted to invert and swap the complementary PWM signals. Further, the switch 510 includes inputs to receive the received complementary PWM signals. The switch 510 is responsive to control logic 512 to selectively output one of the received complementary PWM signals or the cross-coupled logic-inverted complementary PWMB and PWMD signals at the outputs 514 and 516.

In a particular embodiment, the pulse edge control circuit 502 is adapted to selectively chop (selectively invert and swap) the received complementary PWM signals at integer sub-multiples of a frame repetition rate. Further, the control logic 512 may be within or external to the pulse edge control circuit 502 and is adapted to control the switch 510 to select between the received complementary PWM signals or the chopped complementary PWM signals at selected frame intervals to produce modulated complementary PWM signals with a changed power spectrum, a suppressed carrier power, or any combination thereof, without changing at least one of a frame repetition rate, a duty cycle, a differential carrier frequency, and a differential baseband signal. The pulse edge control circuit 502 provides either the received complementary PWM signals or the cross-coupled logic-inverted complementary PWM signals to the at least two outputs 514 and 516.

In a particular embodiment, the control logic 512 is adapted to adjust over time the integer sub-multiple of the frame repetition rate by controlling the operation of switch 510. In a particular example, the control logic 512 can adjust over time the switching interval of the switch 510 to suppress a carrier power, to whiten the power spectrum, to concentrate carrier energy at frequencies other than the carrier frequency, or any combination thereof. Further, the control logic 512 is adapted to control the switch 510 to periodically or randomly provide the complementary PWM signals or the cross-coupled logic-inverted complementary PWM signals to the outputs 514 and 516. Periodic chopping can suppress a carrier and move carrier energy to other frequencies in the output spectrum. Random chopping can spread and whiten the power spectrum. Further, by applying a constructed switching pattern, the whitened output power spectrum can be further shaped and the particular patterns can be used to introduce notches at particular frequencies.

Figure 6:
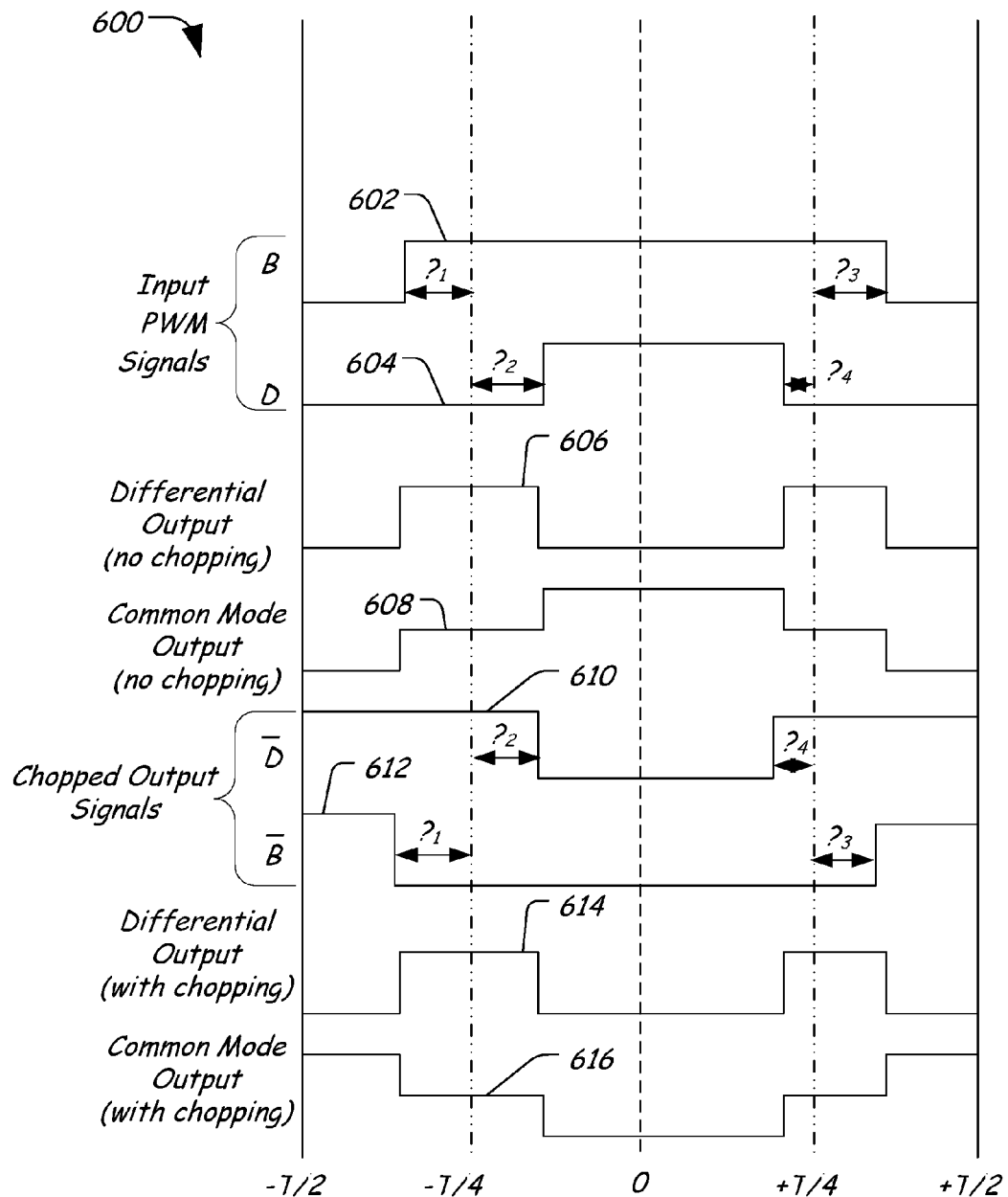
FIG. 6 is a graph of a particular illustrative timing diagram illustrating frame centered complementary PWM pulses using a chopping technique.

FIG. 6 is a graph of a particular illustrative timing diagram 600 illustrating frame centered complementary PWM pulses (PWMB pulse 602 and PWMD pulse 604) using a simple, logic-inverted cross-connection for common mode carrier suppression. The PWMB and PWMD pulses 602 and 604 result in a differential output 606, that has pulses that are approximately centered about a quarter of the PWM frame (i.e., at ±T/4). The common mode output 608 includes a peak positive amplitude that is located at approximately the center of the PWM frame (i.e., at T=0).

As shown, the PWMD pulse 604 is inverted and cross-coupled to become the chopped PWMB pulse 610, and the PWMB pulse 602 is inverted and cross-coupled to become the chopped PWMD pulse 612. A resulting differential output 614 is unchanged from the differential output 606 for the non-chopped output. However, the common mode output 616 is phase shifted by approximately T/2 (or π) while preserving the differential pulse width and position within each half frame.

Figure 7:
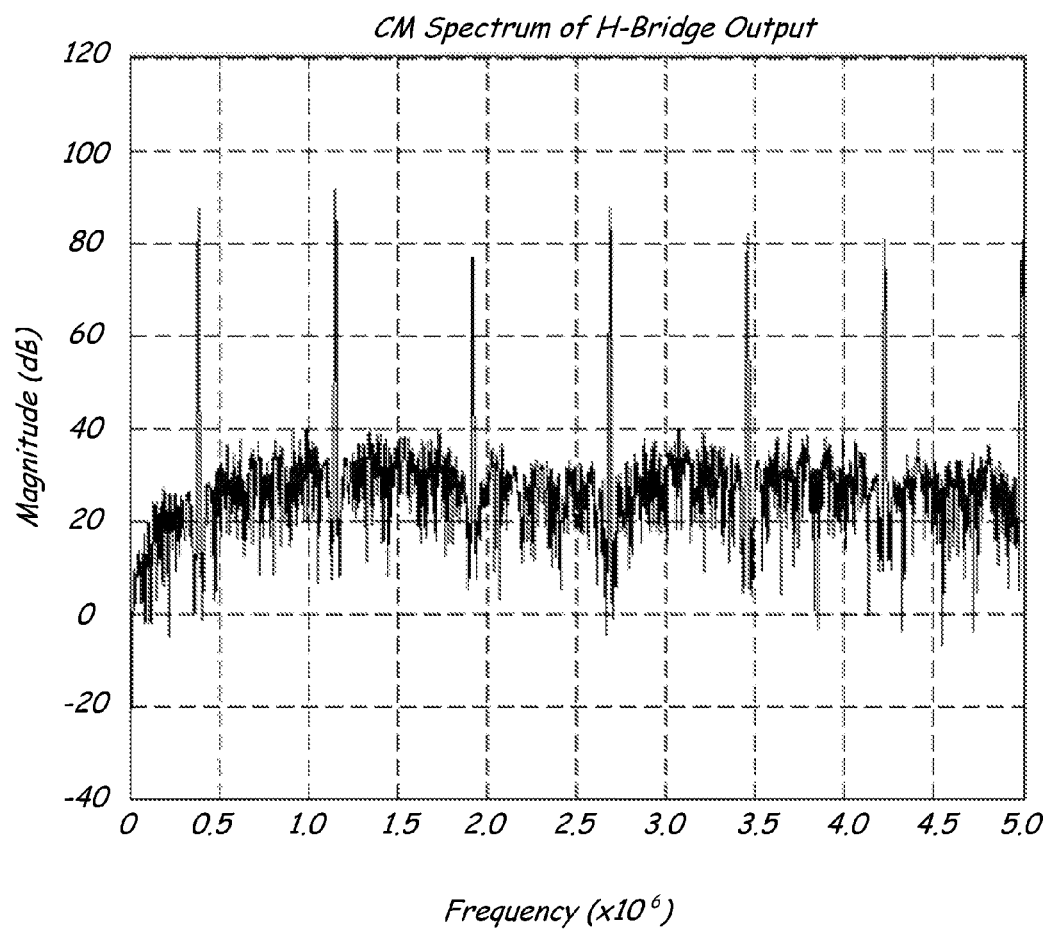
FIG. 7 is a graph of a particular illustrative embodiment of a common mode spectrum of magnitude in decibels versus frequency resulting from periodic chopping of the BD-D PWM signal at frame boundaries where the frame rate is 768 kHz.

FIG. 7 is a graph of a particular illustrative embodiment of a common mode spectrum 700 of magnitude in decibels versus frequency resulting from periodic chopping of the BD-D PWM signal at frame boundaries where the frame rate is 768 kHz and the chopping frequency integer sub-multiple variable (n) is two (2). The common mode spectrum 700 illustrates that periodic chopping of the PWM signal (either logically inverting and swapping complementary PWM signals or generating a logic-inverted, duty cycle complement of a received PWM signal, and alternately outputting the PWM signal(s) or the logic-inverted duty cycle complement) suppresses the carrier energy at the carrier frequency and its harmonics, and produces side band tones at (1±1/n) times the PWM carrier frequency, where (n) is the chopping frequency integer sub-multiple variable.

Figure 8:
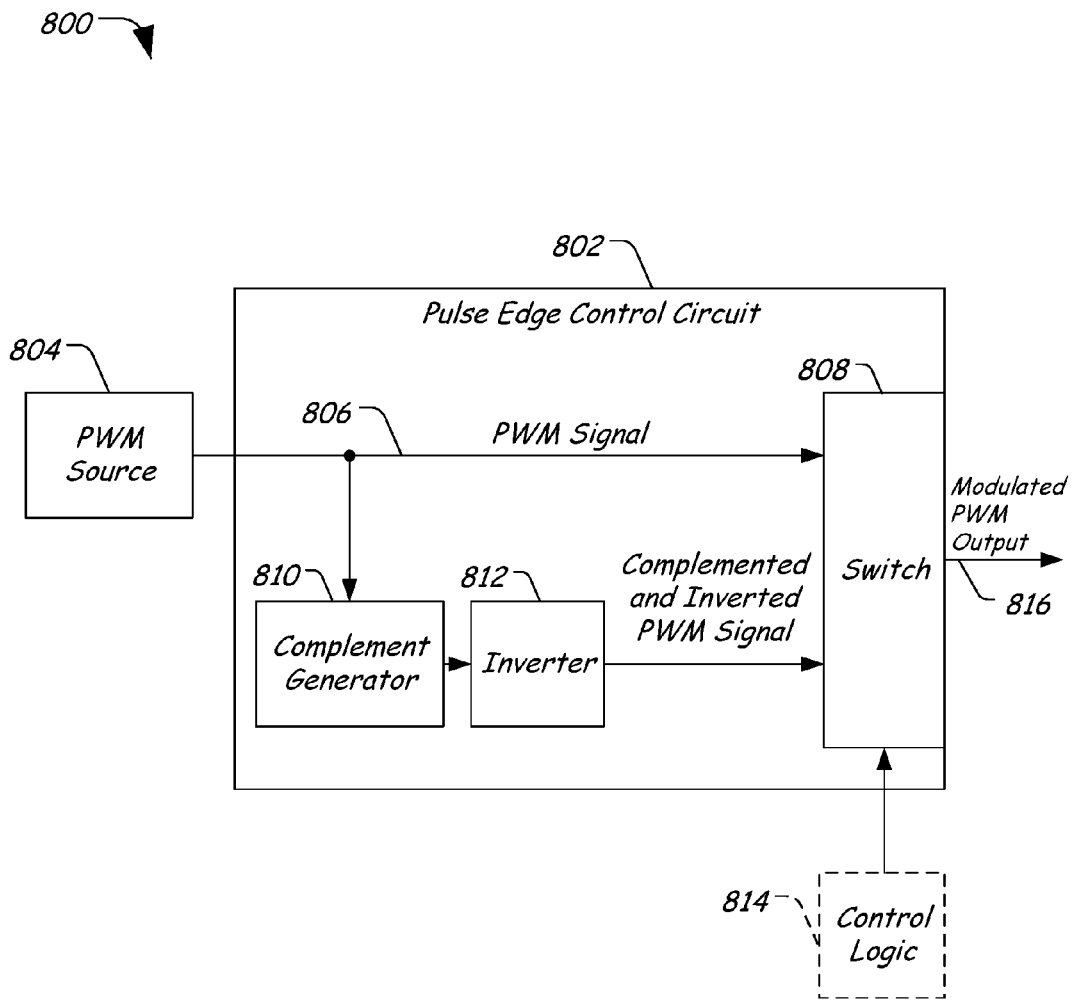
FIG. 8 is a block diagram of a third particular illustrative embodiment of a system to suppress a pulse-width modulation (PWM) carrier.

FIG. 8 is a block diagram of a third particular illustrative embodiment of a system 800 to suppress a pulse-width modulation (PWM) carrier. The system 800 includes a pulse edge control circuit 802 to receive at least one pulse-width modulated (PWM) signal from a PWM source 804 at an input 806 that is coupled to a switch 808 and to a complement generator 810. The complement generator 810 is adapted to generate a duty-cycle complement of the received PWM signal. The complement generator 810 provides the duty-cycle complement of the PWM signal to a logical inverter 812, which logic-inverts the duty-cycle complement PWM signal to provide a logic-inverted duty-cycle complement of the PWM signal to a second input of the switch 808. The system 800 further includes control logic 814 that is coupled to the switch 808. The control logic 814 is illustrated in phantom, because the control logic 814 can be included in or can be separate from the pulse edge control circuit 802. The control logic 814 is adapted to control the switch 808 to selectively provide one of the received PWM signal or the logic-inverted duty-cycle complement of the received PWM signal to an output 816 as a modulated PWM output signal.

In general, the pulse edge control circuit 802 can be a single input circuit device that is adapted to generate a logic-inverted duty cycle complement related to the received PWM signal and to selectively swap the received PWM signal with the logic-inverted duty-cycle complement at a temporal location within the frame at discrete time intervals over a sequence of frames to produce the modulated PWM output signal at the output 816. In general, the pulse edge control circuit 802 is adapted to selectively apply the chop operation at a temporal location within the frame, such as at a frame boundary, a mid-point location within the frame (e.g., T/2), where T represents a temporal frame width), at a quarter-frame location (e.g., T/4), or at another temporal location.

In a particular embodiment, the control logic 814 is adapted to provide a control signal to a control input of the pulse edge control circuit 802 to adjust the chopping frequency (i.e., the integer sub-multiple of the frame repetition rate times the frame repetition rate) to selectively chop the received PWM signal at an adjusted interval over a sequence of frames. In a particular example, the control logic 814 is adapted to control the switch 808 to selectively switch between the received PWM signal and the logic-inverted, duty-cycle complement of the PWM signal in groups of frames or sequences of frames, so that a first sequence of frames includes the received PWM signal and a second sequence of frames includes the logic-inverted, duty-cycle complement of the PWM signal. In a particular example, the selective control of the switch 808 can be used to shape a power spectrum associated with the at least one modulated PWM output signal at the output 816.

Figure 9:
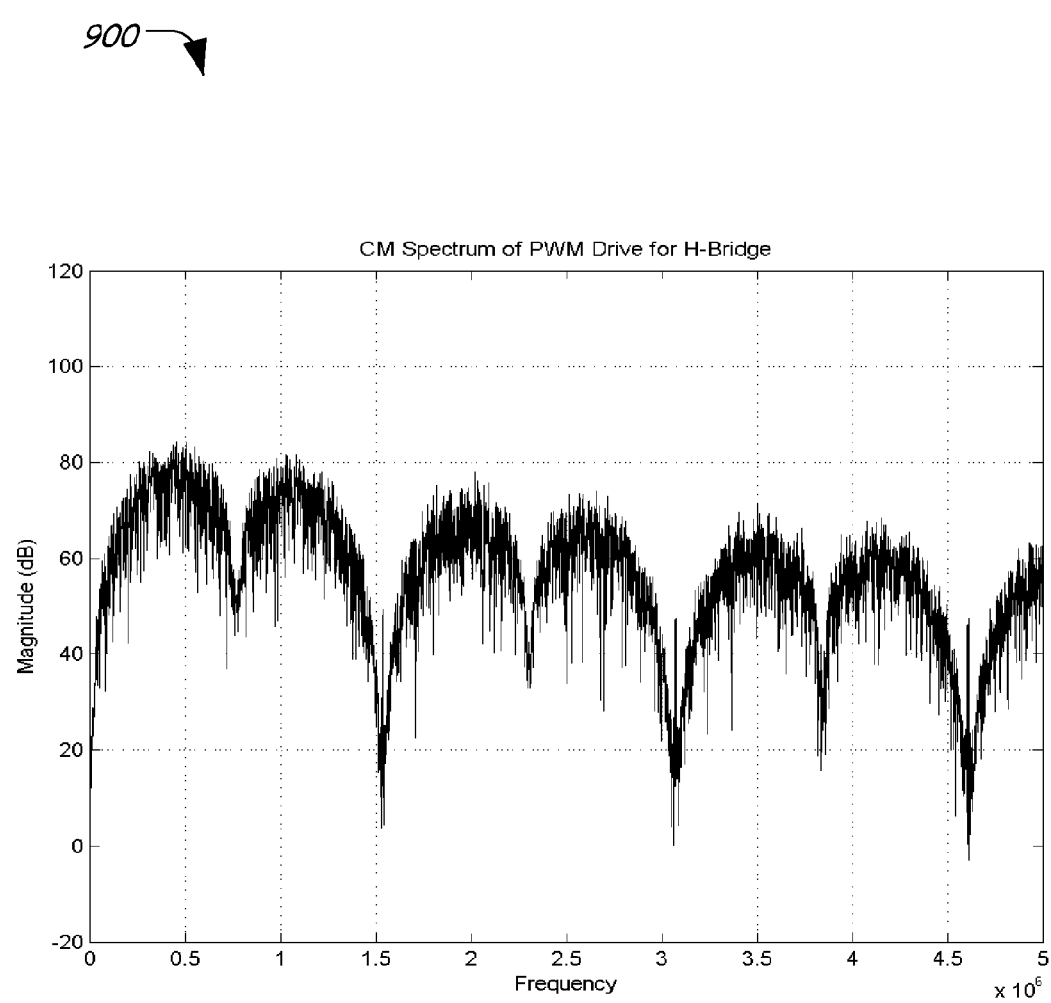
FIG. 9 is a graph of a particular illustrative embodiment of a common mode spectrum of magnitude in decibels versus frequency resulting from random chopping of the BD-D PWM signal at frame boundaries where the frame rate is 768 kHz.

FIG. 9 is a graph of a particular illustrative embodiment of a common mode spectrum 900 of magnitude in decibels versus frequency resulting from random chopping of the BD-D PWM signal at frame boundaries where the frame rate is 768 kHz. The common mode spectrum 900 illustrates that random chopping of the PWM signal (either logically inverting and swapping complementary PWM signals or generating a logic-inverted, duty cycle complement of a received PWM signal, and selectively outputting the PWM signal(s) or the logic-inverted duty cycle complement) whitens the PWM common mode output signal and significantly reduces its peak energy level.

Figure 10:
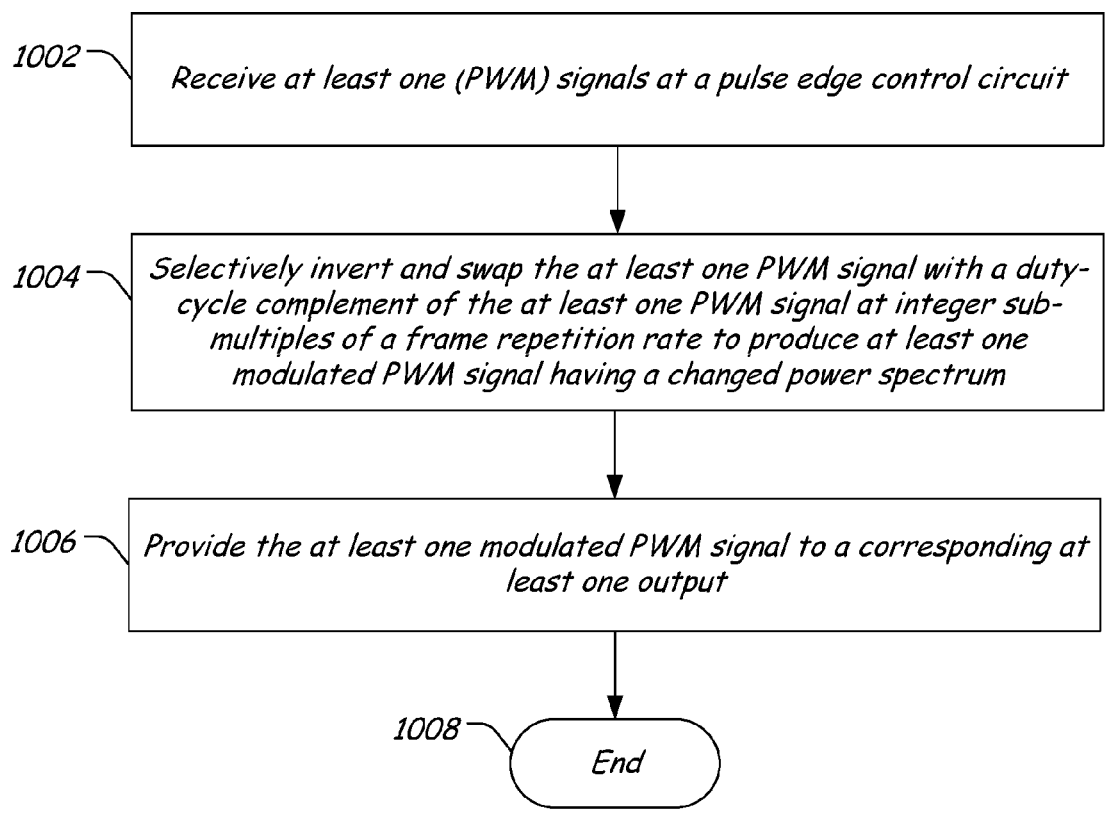
FIG. 10 is a flow diagram of a particular illustrative embodiment of a method of changing a pulse-width modulation (PWM) power spectrum using a PWM chopping technique.

FIG. 10 is a flow diagram of a particular illustrative embodiment of a method of changing a pulse-width modulation (PWM) power spectrum using a PWM chopping technique. At 1002, at least one pulse-width modulated (PWM) signal is received at a pulse edge control circuit. Advancing to 1004, the at least one PWM signal is selectively inverted and swapped with a duty cycle complement of the at least one PWM signal at integer sub-multiples of a frame repetition rate to produce at least one modulated PWM signal having a changed power spectrum. In a particular embodiment, selectively inverting and swapping includes selectively chopping and not chopping the received at least one PWM signal and its duty cycle complement. Further, in a particular example, selectively chopping and not chopping the received at least one PWM signal and its duty cycle complement is performed at periodic intervals, at random intervals, or using particular patterns of chopping and not chopping to alter the output power spectrum. Moving to 1006, the at least one modulated PWM signal is provided to a corresponding at least one output. The method terminates at 1008.

In a particular embodiment, the at least one modulated PWM signal has reduced electromagnetic interference (EMI) and radio frequency (RF) interference at particular frequencies relative to the at least one PWM signal. Further, in another particular embodiment, the at least one modulated PWM signal has a suppressed power at the carrier frequency, concentrates carrier energy at frequencies other than the carrier frequency, has a whitened power spectrum, or any combination thereof. In still another particular embodiment, the at least one modulated PWM signal is produced without changing at least one of the frame repetition rate and a carrier frequency.

In a particular example, if two PWM signals are received, the system can be adapted to selectively output either the two PWM signals or a chopped version of the two PWM signals. In the latter case, the two PWM signals are logically inverted and swapped and then provided to the output. By selectively chopping or not chopping the two PWM signals, the resulting output signal can have an altered power spectrum. By controlling the chopping intervals or the chopping pattern, the power spectrum can be shaped in particular ways, such as by concentrating carrier energy at frequencies other than the carrier frequency, by suppressing carrier energy at the carrier frequency, by whitening the power spectrum, by introducing notches at particular frequencies in the power spectrum, or any combination thereof.

Figure 11:
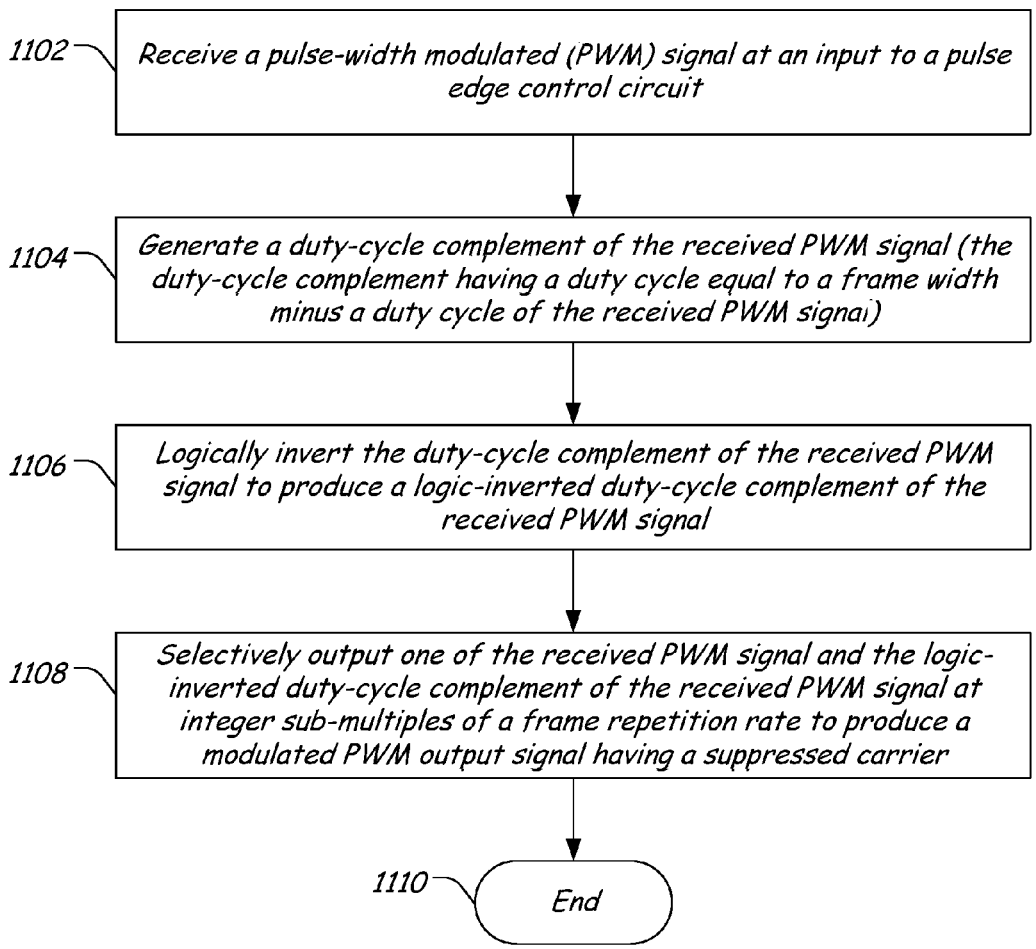
FIG. 11 is a flow diagram of a second particular illustrative embodiment of a method of changing a pulse-width modulation (PWM) power spectrum using a PWM chopping technique on a single input system.

FIG. 11 is a flow diagram of a second particular illustrative embodiment of a method of changing a pulse-width modulation (PWM) power spectrum using a PWM chopping technique on a single input system. At 1102, a pulse-width modulated (PWM) signal is received at an input to a pulse edge control circuit. Moving to 1104, a duty-cycle complement of the received PWM signal is generated. In a particular example, the received PWM signal and the duty-cycle complement have an aggregate duty cycle that equals 100% of the frame width (i.e., an entire width of the frame) within limits of quantization effects. Proceeding to 1106, the duty-cycle complement of the received PWM signal is logically inverted to produce a logic-inverted, duty-cycle complement of the received PWM signal. In a particular embodiment, the PWM chopping technique is selectively applied at a temporal location within the frame, such as at a frame boundary or at another location within the frame. Continuing to 1108, one of the received PWM signal and the logic-inverted, duty-cycle complement of the received PWM signal are selectively output at integer sub-multiples of a frame repetition rate to produce a modulated PWM output signal having a suppressed carrier power, a concentrated carrier energy at frequencies other than the carrier frequency, a whitened power spectrum, or any combination thereof. The method terminates at 1110.

In a particular embodiment, the method further includes receiving a control signal value for adjusting the chopping frequency to a specific integer sub-multiple of the frame repetition rate. For example, a sequence of control signal values can be applied to adjust over time the integer sub-multiple of the frame repetition rate to shape a power spectrum associated with the modulated PWM signal.

In connection with the circuit devices and methods disclosed above, a pulse edge control circuit is disclosed that is adapted to selectively apply a chop operation to at least one received PWM signal to produce at least one modulated PWM signal having a changed power spectrum. Selectively chopping includes periodically or randomly chopping or not chopping the at least one received PWM signal with its duty cycle complement at discrete time intervals. In a particular example, the random or periodic chopping operations can shape the output power spectrum to whiten noise, to suppress a carrier power, to shift or concentrate carrier energy to frequencies other than the carrier frequency, or any combination thereof. In another particular example, the selective chopping operation is adapted to suppress a carrier without altering the frame repetition rate, the carrier frequency, a differential mode component, or any combination thereof.

Although the present invention has been described with reference to preferred embodiments, workers skilled in the art will recognize that changes may be made in form and detail without departing from the spirit and scope of the invention.

What is claimed is:

1. A circuit comprising:
a pulse edge control circuit to receive at least one pulse-width modulated (PWM) signal from a PWM source, the pulse edge control circuit adapted to selectively swap the at least one PWM signal with a logic inverted, duty-cycle complement of the at least one PWM signal to produce at least one modulated PWM signal having a changed power spectrum, the pulse edge control circuit to provide the at least one modulated PWM signal to at least one output of the pulse edge control circuit.

2. The circuit of claim 1, wherein the pulse edge control circuit further comprises:
a control input adapted to receive a control signal;
wherein the pulse edge control circuit is responsive to the control signal to selectively swap the at least one PWM signal with the logic inverted, duty-cycle complement for each sequential frame to selectively adjust a shape of the changed power spectrum.

3. The circuit of claim 1, wherein the at least one modulated PWM signal is produced without changing an effective duty cycle associated with the at least one PWM signal from frame to frame.

4. The circuit of claim 1, wherein the pulse edge control circuit is adapted to generate the logic inverted, duty cycle complement signal from the at least one PWM signal.

5. The circuit of claim 4, wherein the logic inverted, duty cycle complement signal is generated such that its duty cycle is nominally equal to an entire width of a frame minus a duty cycle of the at least one PWM signal within limits of quantization effects.

6. The circuit of claim 1, wherein the pulse edge control circuit selectively swaps the at least one PWM signal with the logic inverted, duty-cycle complement at a particular temporal location within a PWM frame over a sequence of PWM frames.

7. The circuit of claim 6, wherein the pulse edge control circuit is adapted to selectively swap the at least one PWM signal with the logic inverted, duty cycle complement at a PWM frame boundary.

8. The circuit of claim 6, wherein the pulse edge control circuit is adapted to selectively swap the at least one PWM signal with the logic inverted, duty cycle complement at a temporal location within the PWM frame corresponding to at least one of a quarter of a frame width, half of the frame width, and three-quarters of the frame width of the PWM frame.

9. The circuit of claim 1, wherein the pulse edge control circuit is adapted to selectively swap the at least one PWM signal with the logic inverted, duty cycle complement according to a constructed pattern to concentrate a carrier signal energy at frequencies other than a carrier frequency of the at least one modulated PWM signal.

10. The circuit of claim 1, wherein the pulse edge control circuit is adapted to selectively swap the at least one PWM signal with the logic inverted, duty cycle complement according to a random pattern to whiten a power spectrum of the at least one modulated PWM signal to produce the changed power spectrum.

11. A system comprising:
an input terminal configurable to receive a PWM signal pair;

an output terminal; and a pulse edge control circuit coupled to the input terminal and adapted to selectively apply a chopping operation to the PWM signal pair to produce a modulated PWM output having a changed power spectrum, the pulse edge control circuit to provide the modulated PWM output to the output terminals.

12. The system of claim 11, wherein the output terminal is configurable to couple to an external circuit;

wherein the modulated PWM output has reduced electromagnetic interference (EMI) and radio frequency (RF) interference at particular frequencies relative to that of the at the PWM signal pair without coupling a filter to the output terminal.

13. The system of claim 11, wherein the pulse edge control circuit produces the modulated PWM output without changing at least one of a frame repetition rate and a carrier frequency of the PWM signal pair.

14. The system of claim 11, wherein the pulse edge control circuit modulates each pulse edge of the PWM signal pair to produce the modulated PWM output.

15. The system of claim 11, wherein the pulse edge control circuit modulates at least two pulse edges of the PWM signal pair to produce the modulated PWM output.

16. The system of claim 15, wherein a first PWM signal of the PWM signal pair has a fixed pulse width, and wherein the pulse edge control circuit modulates both pulse edges of a second PWM signal of the PWM signal pair.

17. The system of claim 11, wherein the output terminal is configurable to be coupled to a speaker to provide the modulated PWM output for an audio application.

18. The system of claim 11, wherein the output terminal is configurable to be coupled to a switched power circuit to provide the modulated PWM output for a power control application.

19. The system of claim 11, wherein the output terminal is configurable to be coupled to a motor control circuit to provide the modulated PWM output for a motor control application.

20. The system of claim 11, wherein common mode carrier energy of the modulated PWM output is suppressed without changing a differential baseband signal associated with the PWM signal pair.

21. A method comprising:

receiving at least one pulse-width modulated (PWM) signal at a pulse edge control circuit;

selectively swapping the at least one PWM signal with a logic inverted, duty cycle complement of the at least one PWM signal to produce at least one modulated PWM signal having a changed power spectrum; and providing the at least one modulated PWM signal to a corresponding at least one output.

22. The method of claim 21, wherein the at least one PWM signal and the logic inverted, duty cycle complement are selectively swapped at a discrete time interval within a PWM frame associated with the at least one PWM signal; and wherein the discrete time interval is an integer sub-multiple of a frame repetition rate of the at least one PWM signal.

23. The method of claim 21, wherein selectively swapping comprises alternately swapping and not swapping the at least one PWM signal.

24. The method of claim 23, wherein alternately swapping and not swapping the at least one PWM signal is performed at periodic intervals to concentrate carrier signal energy at frequencies other than a carrier frequency within the changed power spectrum.

25. The method of claim 23, wherein alternately swapping and not swapping the at least one PWM signal is performed at random intervals to whiten carrier signal energy within the changed power spectrum.

26. The method of claim 21, wherein the at least one modulated PWM signal has reduced electromagnetic interference (EMI) and radio frequency (RF) interference at particular frequencies relative to that of the at least one PWM signal.

\* \* \* \* \*